United States Patent [19]
Scholes

[11] 3,933,457
[45] Jan. 20, 1976

[54] APPARATUS AND METHOD FOR TREATING VITREOUS SURFACES

[75] Inventor: Addison B. Scholes, Muncie, Ind.

[73] Assignee: Ball Corporation, Muncie, Ind.

[22] Filed: May 21, 1974

[21] Appl. No.: 472,044

Related U.S. Application Data

[63] Continuation of Ser. No. 54,417, July 13, 1970, abandoned.

[52] U.S. Cl. ............... 65/60; 65/157; 427/253; 427/422
[51] Int. Cl.² ........................................ C03C 17/22
[58] Field of Search ......... 65/60, 157; 427/253, 422

[56] References Cited
UNITED STATES PATENTS

| | | | |
|---|---|---|---|
| 3,438,803 | 4/1969 | Dubble et al. | 118/48 X |
| 3,498,819 | 3/1970 | Lyle et al. | 65/60 X |
| 3,516,811 | 6/1970 | Gatchet et al. | 65/157 |

*Primary Examiner*—Arthur D. Kellogg
*Attorney, Agent, or Firm*—Gilbert E. Alberding

[57] ABSTRACT

Apparatus and method for surface treating vitreous materials with treatment gases to form a metallic oxide surface condition on the vitreous material. The apparatus, which is preferably an enclosure having an entrance and exit end and is mounted over a conveyor belt, incorporates manifold means for distributing the treatment gas within the enclosure and also heating means for maintaining the interior of the enclosure above a critical temperature. The method comprised is applying a treatment gas to the vitreous surface while maintaining the gas above a critical temperature substantially below the pyrolitic decomposition temperature which is necessary to accomplish the actual surface treatment.

7 Claims, 2 Drawing Figures

INVENTOR.
ADDISON B. SCHOLES
BY
Campbell, Harris and Rouhle

APPARATUS AND METHOD FOR TREATING VITREOUS SURFACES

This application is a continuation of my earlier copending application Serial No. 54,417 filed July 13, 1970 now abandoned.

BACKGROUND OF THE INVENTION

The present invention relates to an apparatus and method for surface treating vitreous material, for example, glass and glazed surfaces such as china or porcelain.

Vitreous surfaces have, particularly immediately following the formation of the surfaces, high free energy. The nature of the surface makes it susceptible to abrasion damage from other similar surfaces and to undesirable reactions with the atmosphere and/or other materials it may contact. One of the more troublesome and technically demanding aspects of this situation is the treatment of newly formed glassware. Food and beverage bottles, for instance, are quite strong, at least theoretically, when formed, but, unless protected, undergo strength degradation as a result of contact with other bottles and attack by the atmosphere. Moisture in the atmosphere is particularly detrimental to the newly formed, unprotected glass surface. When it is considered that these bottles are processed on high-speed filling and packing lines which constantly jostle the bottles together with substantial force, it will be appreciated that damage can occur as a result of the mutual contact between the bottles. In fact, pristine, treated glass bottles are unsuited for use in modern packing lines unless greatly increased quantities of glass are included to compensate for the damage in loss and strength.

As is known in the art, the problem of abrasion and atmospheric damage to glassware has been, in large part, solved by various surface treatments on the glass substantially immediately upon formation or at least prior to packing of the glass. One basic and most important facet of such treatments is the surface treatment of the glass, prior to annealing, with various metallic compounds which pyrolytically decompose upon contact with the heated, freshly formed glass to form metallic oxide surface layers on the glass or other vitreous material. Exemplary of the more widely used and better performing of these metal oxide treatments is the formation of tin oxide on glass surfaces by exposure to stannic chloride vapor. The tin oxide surface treatment when present in films less than that which would cause objectionable light interference and iridescence, produces a surface condition which is lubricous, highly resistant to abrasion damage and protective against atmospheric attack.

While stannic chloride does not decompose to form a tin oxide layer on the glass surface until exposed to temperatures on the order of 1000° F., it has been found that the stannic chloride vapor is subject to degradation through exposure to moisture. For that reason, it has been common practice to bubble dry air through the stannic chloride liquid to form the stannic chloride vapor in an air carrier. When free of water, air has been found to be a substantially inert carrier gas for stannic chloride vapor. Further, it has been possible to conduct the dry air containing stannic chloride vapor to the heated glass surface without encountering substantial problems. For this reason, treatment of glass with stannic chloride has been widely accepted and is in standard commercial use.

Unfortunately, after the stannic chloride vapor is vented into a coating enclosure and passed over the glass surface, a substantial residue of stannic chloride vapor remains which has not been pyrolytically decomposed. As a result of the practicalities of the coating situation, such as moist air admitted into the enclosure with the ware to be treated, the vapor in the enclosure comes into contact with moisture. When so exposed, stannic chloride forms a sticky, objectionable material which has an obnoxious vapor, coats surfaces which it contacts and, further, tends to corrode and attack such surfaces. This results in plugged vents, corroded hoods, and precludes any possible recycle of the stannic chloride vapor. For these reasons, it has to be the practice to vent the stannic chloride vapor to the atmosphere after exposing it to the glass.

While the background has been presented with regard to glassware, this has been done because the problems involved in treating glassware with metallic oxide compositions are most demanding. Also, stannic chloride has been used as illustrative of the treatment gases. This has been done because of the widespread use of such treatment gas. However, the problems discussed exist in greater or lesser extent with regard to other vitreous surfaces and other treatment gases employed to produce metallic oxide surface treatments. These are the treatment gases which will be more widely illustrated below.

SUMMARY OF THE INVENTION

The present invention relates to a method whereby treatment gas for producing metallic oxide treatments of vitreous materials can be rendered innocuous relative to the surroundings rather than noxious as is the situation with conventional coating methods. More specifically, it has been discovered that if the treatment gas is maintained at or above a critical temperature substantially below the pyrolytic decomposition temperature which is involved in the actual surface treatment, the treatment gases do not, upon exposure to moisture and air, form objectionable and corrosive layers on the apparatus, do not hydrolyze into dangerous constituents and are likewise compatible and unobjectionable substances. In the case of stannic chloride, the treatment gas must be maintained above a temperature within the range of about 185° F. to 195° F., and preferably above 187° F. Other treatment gases display similar well known temperatures at which they will not undergo hydrolysis when exposed to water vapor.

The invention, of course does not involve new physical or chemical laws. Rather, by forcing the working temperatures of the coating gas into ranges substantially above these normally encountered, the propensity of the coating gases to form hydrates is avoided. The hydrates tend to form objectionable coatings and are themselves very hydroscopic in nature. Thus, the additional water attracted results in hydrolysis and, in the place of stannic chloride, the formation of hydrochloric acid. It will be recognized that great difficulties have been encountered in attempting to vent the treatment gases and temperatures below those disclosed in the instant invention and, without maintaining the critical temperature, the treatment gases would accumulate in the vicinity of the coating operation with obvious adverse affects. The unstable and corrosive nature of the hydrates made it difficult to even conduct the gases to appropriate anti-polluting equipment.

Another facet of the instant invention involves the now possible expediency of recycling the treatment gas and the use of heated but not dry air to form the stannic chloride vapor initially. Thus, if the temperature is maintained above the critical temperature of the instant invention, air and coating material within the coating enclosure could be bled therefrom, exposed to the stannic chloride liquid to form additional stannic chloride vapor and returned to the enclosure. This has been attempted previously but, since the critical temperature of the instant invention was not maintained, the treatment gas formed corrosive deposits which plugged the lines and corroded the equipment.

From the above discussion, it will be appreciated that the instant invention by a most simple and readily understood expedient completely avoids the serious and longstanding problem of clogging and corrosion of treatment equipment. Further, the instant invention permits recycling of the treatment gas or safe and trouble-free transfer of surplus treatment gas to appropriate scrubbing or other purification means which are conventionally located somewhere remote from the actual manufacturing area. After being conducted to, for instance, a water scrubber, the temperature of the gas is allowed to drop below the critical temperature of the instant invention, exposed to water, hydrolyzed, and neutralized. Previously, even a short run of vent pipe which often connected with the atmosphere was subject to frequent failure and plugging as a result of the formation of corrosive deposits within the vent.

DESCRIPTION OF THE PREFERRED EMBODIMENT

Figure 1:
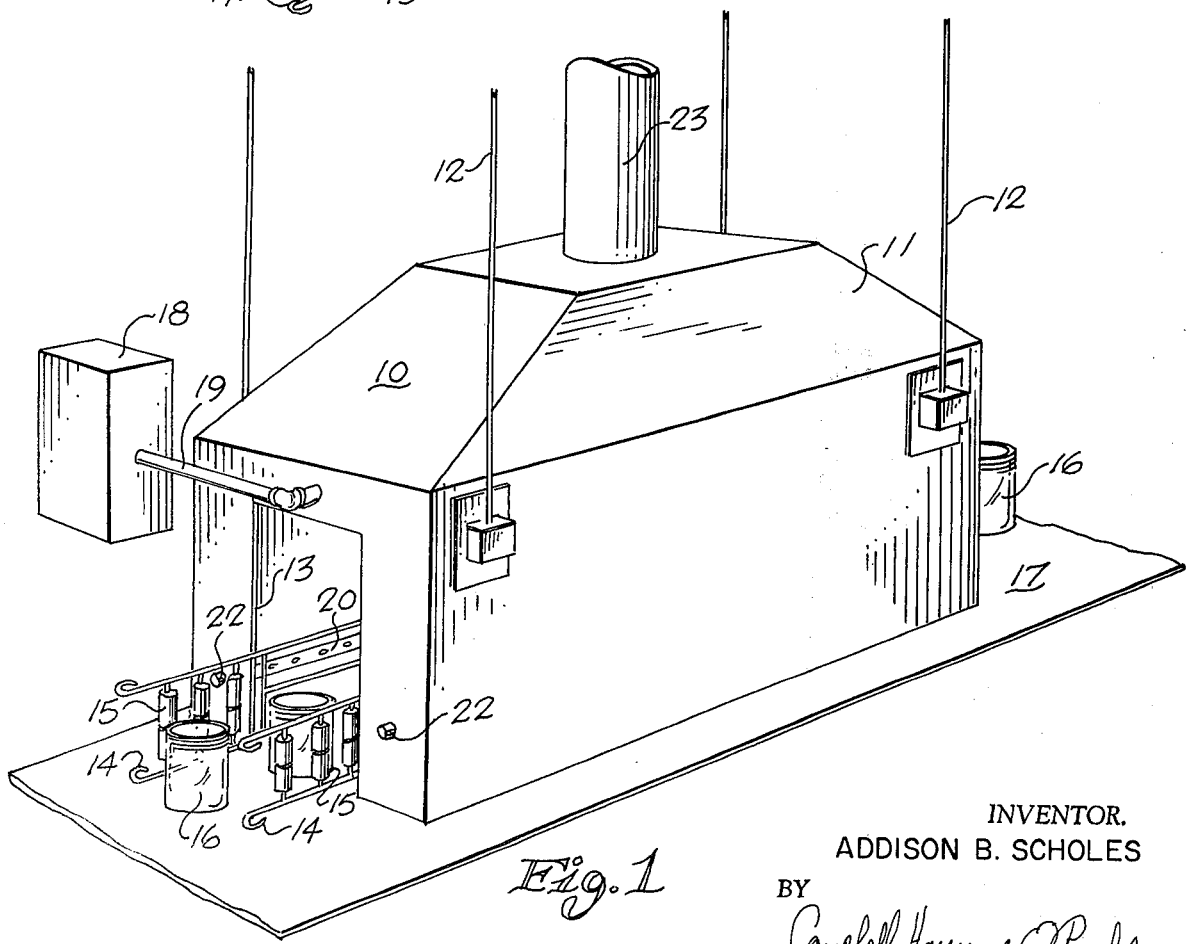
FIG. 1 is a perspective view of a coating apparatus and auxiliary equipment constructed according to the present invention.

Treatment apparatus, according to the instant invention, is generally indicated in the drawings by reference numeral 10. As illustrated in FIG. 1, apparatus 10 includes an enclosure 11 suspended by support rods 12. An entrance aperture 13 is provided in one end of enclosure 11. Guide bars 14 having rollers 15 mounted therebetween are provided to facilitate the entrance of bottles 16 into entrance of bottles 16 into entrance aperture 13 even when bottles 16 are somewhat misaligned. Bottles 16 are carried on conveyor 17, which is located immediately below enclosure 11.

Treatment gas is formed in vapor generator 18 in a conventional manner and supplied to the interior of enclosure 11 by means of conduit 19. Heating means 20, visible through entrance aperture 13, are provided inside the enclosure 11 in order that the critical minimum temperature of the instant invention may be maintained within enclosure 11. While heating means 20 are illustrated as gas burners fed by pipe 22, it will, of course, be understood that electrical heaters, steam heaters or any other source of auxiliary heat would be appropriate to function as heating means 20.

Communicating with the interior of enclosure 11 and extending from a top portion thereof is vent 23, which conducts excess treatment gas to an appropriate disposal means (not shown). Also, vent 23 may be wholly or partially connected to vapor generator 18 in order that the treatment gas be recycled. However, for the most part, it is possible to recycle the treatment gas merely by setting up an internal flow within enclosure 11, whereby treatment gas is repeatedly recycled over bottles 16. The important point being that treatment gas can be maintained within enclosure 11 for a more or less indefinite period even though moisture laden air enters enclosure 11 through, for example, aperture 13. Conventionally, it was necessary to purge the moisture and the treatment gas from enclosure 11 through vent 23 by providing an excess of dry air and treatment gas from vapor generator 18.

If necessary, vent 23 may, itself, be heated, for example, by wrapping with electrical resistance heaters. However, the heat generated by heating means 20 is usually sufficient to heat the excess treatment gas to and maintain the gas at a temperature above the critical temperature at which hydration of the gas is initiated. Other obvious steps such as insulating vent may also be employed.

Figure 2:
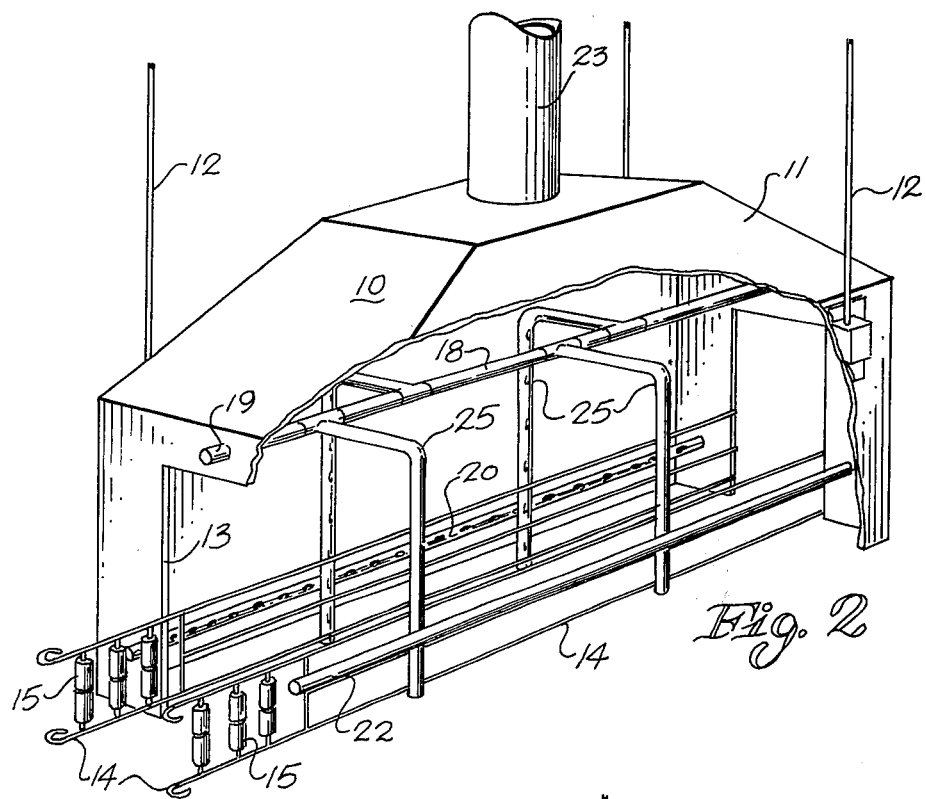
FIG. 2 is a side view of the apparatus shown in FIG. 1, with a portion of the side wall removed to show the interior details.

The interior details of the invention will be more readily appreciated upon consideration of FIG. 2, wherein enclosure 11 is shown partially cut-away. It can be more readily seen that heating means 20 extend through enclosure 11 in the preferred embodiment. Also, it can be more readily recognized that conduit 19, which is connected to vapor generator 18, are also connected to a number of distribution legs 25 which supply the treatment gas throughout the interior of enclosure 11.

The foregoing description and illustration of particular embodiments and a preferred embodiment are given by way of example. Other forms, variations, and modifications may readily be devised by those skilled in the art in accordance with the teachings herein. Therefore, the spirit and scope of the invention is limited only by the following claims.

What is claimed is:

1. A method for coating newly formed vitreous articles with a metal oxide by pyrolytic decomposition of a treatment gas thereon which treatment gas is normally hydrolized in the presence of water vapor into objectionable and corrosive constituents which can then undesirably accumulate on the surfaces of associated treatment equipment to clog, corrode or otherwise interfere with the treatment equipment, said method comprising the steps of:

providing an enclosure having entrance and exit openings therein for the passage of said articles, moving said articles through said enclosure, allowing ambient air of uncontrolled water vapor content to pass into said enclosure through said openings, providing an upwardly extending vent from said enclosure for conducting used treatment gas vapors from said enclosure, directing a supply of said treatment gas inside said enclosure through a distribution manifold on both sides of said articles in a direction towards said articles while said articles are at a temperature above the pyrolytic decomposition temperature of said treatment gas, burning sufficient quantities of heating gas within the enclosure, at locations along both sides of the enclosure between said openings and at a lower level of said enclosure opposite said vent (1) to substantially maintain the atmosphere temperature within said enclosure above a predetermined critical temperature at which water vapor forms hydrates with the treatment gas and, at the same time, (2) to maintain the internal surfaces of the enclosure and of the vent above said critical temperature due to movement of the heated atmosphere therewithin from the lower level where the heating gas is burned to and through said vent whereby said objectionable constituents are substantially prevented from forming either in said atmosphere or on the internal surfaces of said enclosure and vent in spite of the fact that water vapor is present as a combustion product of said heating gas as a contaminant from the external ambient atmosphere entering through said openings.

2. A method as set forth in claim 1 wherein the treatment gas is a tin compound.

3. A method as set forth in claim 2 wherein the tin compound is stannic chloride.

4. A method as set forth in claim 3 wherein the stannic chloride vapor is maintained above a critical temperature within the range of about 185° F. to 195° F.

5. A method as set forth in claim 4 wherein said critical temperature is about 187° F.

6. A method as set forth in claim 1 further comprising the step of:

repeatedly directing a recycle stream of the treatment gas to said articles during said moving and directing steps.

7. Apparatus for coating newly formed vitreous articles with a metal oxide by pyrolytic decomposition of a treatment gas thereon which treatment gas is normally hydrolized in the presence of water vapor into objectionable and corrosive constituents which can then undesirably accumulate on the surfaces of associated treatment equipment to clog, corrode or otherwise interfere with the treatment equipment, said apparatus comprising:

an enclosure having entrance and exit openings therein for the passage of said articles and through which openings ambient air of uncontrolled water vapor content passes into said enclosure, said enclosure also being provided with an upwardly extending vent for conducting used treatment gas vapors from said enclosure, means for moving said articles through said enclosure, manifold distribution means for directing a supply of said treatment gas inside said enclosure through a distribution manifold on both sides of said articles in a direction towards said articles while said articles are at a temperature above the pyrolytic decomposition temperature of said treatment gas, means for burning sufficient quantities of heating gas within the enclosure, at locations along both sides of the enclosure between said openings and at the lower level of said enclosure opposite said vent (1) to substantially maintain the atmosphere temperature within said enclosure above a predetermined critical temperature at which water vapor forms hydrates with the treatment gas and, at the same time, (2) to maintain the internal surfaces of the enclosure and of the vent above said critical temperature due to movement of the heated atmosphere therewithin from the lower level where the heating gas is burned to and through said vent whereby said objectionable constituents are substantially prevented from forming either in said atmosphere or on the internal surfaces of said enclosure and vent in spite of the fact that water vapor is present as a combustion product of said heating gas and as a contaminant from the external ambient atmosphere entering through said openings.

* * * * *